(12) United States Patent
Kim et al.

(10) Patent No.: US 12,274,009 B2
(45) Date of Patent: Apr. 8, 2025

(54) LAMINATOR

(71) Applicant: DOOSAN CORPORATION, Seoul (KR)

(72) Inventors: Sungmoon Kim, Yongin-si (KR); Hyungrae Roh, Yongin-si (KR); Kwangseok Park, Yongin-si (KR); Sanghwa Kim, Yongin-si (KR)

(73) Assignee: DOOSAN CORPORATION, Seoul (KR)

( * ) Notice: Subject to any disclaimer, the term of this patent is extended or adjusted under 35 U.S.C. 154(b) by 192 days.

(21) Appl. No.: 17/794,064

(22) PCT Filed: Dec. 14, 2020

(86) PCT No.: PCT/KR2020/018276
§ 371 (c)(1),
(2) Date: Jul. 20, 2022

(87) PCT Pub. No.: WO2021/149917
PCT Pub. Date: Jul. 29, 2021

(65) Prior Publication Data
US 2023/0049939 A1 Feb. 16, 2023

(30) Foreign Application Priority Data
Jan. 22, 2020 (KR) .......................... 10-2020-0008443

(51) Int. Cl.
*B32B 37/06* (2006.01)
*B32B 15/08* (2006.01)
(Continued)

(52) U.S. Cl.
CPC ............ *H05K 3/285* (2013.01); *B32B 15/08* (2013.01); *B32B 15/20* (2013.01); *B32B 27/281* (2013.01);
(Continued)

(58) Field of Classification Search
CPC ..................................................... B32B 37/06
See application file for complete search history.

(56) References Cited

U.S. PATENT DOCUMENTS

| 5,975,178 A | 11/1999 | Otsuka et al. |
| 2008/0230168 A1 | 9/2008 | Wen et al. |

(Continued)

FOREIGN PATENT DOCUMENTS

| JP | 3555926 B2 * | 5/2004 |
| JP | 4936740 B2 | 3/2012 |

(Continued)

OTHER PUBLICATIONS

Extended European Search Report dated Nov. 9, 2023 in European Application No. 20915401.2.
International Search Report for PCT/KR2020/018276 dated Mar. 31, 2021.

*Primary Examiner* — Jeffry H Aftergut
(74) *Attorney, Agent, or Firm* — Sughrue Mion, PLLC

(57) ABSTRACT

A laminator is disclosed. The laminator includes a substrate supply part for supplying a substrate on which a metal pattern is formed; a coverlay supply part for supplying a film to which a plurality of coverlays is attached; a heating roller part for bonding the substrate and the film so that the plurality of coverlays respectively covers the metal pattern; a substrate tension adjustment part and a film tension adjustment part; a bonding state image photographing part for measuring an interval between the plurality of coverlays after the substrate and the film are bonded; and an adjustment part for adjusting the substrate tension adjustment part or the film tension adjustment part so that the interval between the plurality of coverlays measured by the bonding state image photographing part maintains a preset allowable interval.

15 Claims, 6 Drawing Sheets

(51) Int. Cl.
    *B32B 15/20*     (2006.01)
    *B32B 27/28*     (2006.01)
    *B32B 37/00*     (2006.01)
    *B32B 37/20*     (2006.01)
    *B32B 38/18*     (2006.01)
    *B32B 41/00*     (2006.01)
    *B65H 23/188*    (2006.01)
    *H05K 3/28*      (2006.01)

(52) U.S. Cl.
    CPC ........ *B32B 37/0053* (2013.01); *B32B 37/025* (2013.01); *B32B 37/06* (2013.01); *B32B 37/206* (2013.01); *B32B 38/1841* (2013.01); *B32B 41/00* (2013.01); *B65H 23/1888* (2013.01); *B32B 2311/12* (2013.01); *B32B 2379/08* (2013.01); *B32B 2457/08* (2013.01); *B65H 2555/40* (2013.01); *H05K 2203/068* (2013.01)

(56) References Cited

U.S. PATENT DOCUMENTS

2010/0000675  A1    1/2010  Kim et al.
2010/0218897  A1    9/2010  Frolov et al.

FOREIGN PATENT DOCUMENTS

| JP | 2001-334574 A | 5/2012 |
| KR | 10-0733156 B1 | 6/2007 |
| KR | 10-0748208 B1 | 8/2007 |
| KR | 10-2011-0037473 A | 4/2011 |
| KR | 10-1049787 B1 * | 7/2011 |
| KR | 10-1331117 B1 | 11/2013 |
| KR | 10-2015-0077119 A | 7/2015 |
| KR | 10-2015-0129367 A | 11/2015 |
| WO | 2008/002044 A1 | 1/2008 |

* cited by examiner

LAMINATOR

CROSS REFERENCE TO RELATED APPLICATIONS

This application is a National Stage of International Application No. PCT/KR2020/018276 filed Dec. 14, 2020, claiming priority based on Korean Patent Application No. 10-2020-0008443 filed Jan. 22, 2020.

TECHNICAL FIELD

The present invention relates to a laminator, and more particularly, to a laminator used for manufacturing a Flexible Printed Circuit Board (FPCB).

BACKGROUND ART

In general, a Flexible Printed Circuit Board (FPCB) includes a flexible insulating substrate and a metal circuit pattern formed by patterning a metal film, such as Cu foil, on one or both surfaces of the insulating substrate. Since the FPCB may be bent and formed with three-dimensional wiring, space may be efficiently utilized, thereby reducing the size and weight. Accordingly, the FPCB is widely used in various products using thin electronic components.

In addition, the FPCB further includes a coverlay made of a material, such as polyimide film, bonded to the insulating substrate by using a laminator to cover the metal circuit pattern in order to protect the metal circuit pattern printed on the insulating substrate.

As described above, the laminator for bonding the coverlay to the insulating substrate on which the metal circuit pattern is formed may be largely divided into a method using a heating roll and a method using a hot press.

The method using the heating roll has the advantage in that the time required for the bonding process is relatively shorter than the method using the hot press. The method using the hot press cuts the substrate and the coverlay film to a certain size, aligns the cut substrate and coverlay film, and then heat-compresses the substrate and the coverlay film, so that there is a problem in that the time required for the bonding process is relatively long, and the overall apparatus for implementing the bonding process is also complicated. On the other hand, in the method using the heating roll, the time required for the bonding process may be relatively reduced because the heating roll bonds the substrate and the coverlay while continuously moving the substrate and the coverlay film.

However, the method using the heating roll may be easily applied to the manufacturing of a Flexible Flat Cable (FFC) that does not require precise alignment between the substrate and the film, but is not easily applied to the manufacturing of flexible printed circuit boards that require precise alignment when the substrate and the film are bonded. This is because, since the coverlay has to selectively cover the metal circuit pattern printed on the substrate, precise alignment of the substrate and the coverlay film which continuously move toward the heating roll is required. However, there is a problem in that it is difficult to precisely maintain the alignment state of the two types of substrates which are to be bonded to each other in the Roll-to-Roll (R2R) processing.

DISCLOSURE

Technical Problem

Therefore, an object of the present invention to solve this problem is to provide a laminator which performs a bonding process with a Roll-to-Roll (R2R) processing method to improve productivity, and improve precision by controlling tension.

Technical Solution

An exemplary embodiment of the present invention provides a laminator including: a substrate supply part for supplying a substrate on which a metal pattern is formed for each predetermined unit area; a coverlay supply part for supplying a film to which a plurality of coverlays punched to a predetermined size is attached; a heating roller part for bonding the substrate and the film so that the plurality of coverlays respectively covers the metal pattern; a substrate tension adjustment part for adjusting tension of the substrate transferred to the heating roller part; a film tension adjustment part for adjusting the tension of the film transferred to the heating roller part; a bonding state image photographing part for measuring an interval between the plurality of coverlays after the heating roller part bonds the substrate and the film; and an adjustment part for adjusting any one or more of the tension of the substrate adjusted by the substrate tension adjustment part and the tension of the film adjusted by the film tension adjustment part so that the interval between the plurality of coverlays measured by the bonding state image photographing part maintains a preset allowable interval.

Each of the substrate tension adjustment part and the film tension adjustment part may include: a pair of tension adjusting fixed rollers; a pair of tension adjusting variable rollers; and a tension adjusting cylinder for adjusting a distance between the pair of tension adjusting fixed rollers and the pair of tension adjusting variable rollers by moving positions of the pair of tension adjusting variable rollers. The tension adjusting cylinder may operate pneumatically or hydraulically.

The adjustment part may adjust the pneumatic or hydraulic pressure supplied to the tension adjusting cylinder.

Further, the metal pattern may be formed on each of both surfaces of the substrate. Further, the coverlay supply part may include: a first coverlay supply part for supplying a film which is to be bonded to one surface of the substrate; and a second coverlay supply part for supplying a film which is to be bonded to the other surface of the substrate.

The film tension adjustment part may include: a first film tension adjustment part for adjusting the tension of the film supplied by the first coverlay supply part; and a second film tension adjustment part for adjusting the tension of the film supplied by the second coverlay supply part.

The substrate supply part may include: a substrate winder on which the substrate is wound; and a substrate feeder for transferring the substrate wound on the substrate winder to the heating roller part. Further, the coverlay supply part may include: a film winder on which the film is wound; and a film feeder for transferring the film wound on the film winder to the heating roller part.

The heating roller part may include: a pair of first heating rollers opposite to both surfaces of the substrate; and a pair of second heating rollers opposite to both surfaces of the substrate, located behind the pair of first heating rollers to secondarily heat the substrate and the film primarily heated by the pair of first heating rollers.

Further, the bonding state image photographing part may include: a first bonding state image photographing part for measuring an interval between the plurality of coverlays in the substrate and the film bonded by the pair of first heating rollers; and a second bonding state image photographing part for measuring an interval between the plurality of coverlays in the substrate and the film bonded by the pair of second heating rollers.

Further, the heating roller part may include: a pair of heating rollers opposite to both surfaces of the substrate; and a position variable support device for adjusting an interval between the pair of heating rollers by moving a position of any one of the pair of heating rollers.

The position variable support device may include: a ball screw shaft; a support body screwed to the ball screw shaft and supporting any one of the pair of heating rollers; and a servo motor for rotating the ball screw shaft to move a position of the support body.

Further, the position variable support device may further include a load cell for measuring a load applied to the support body. Further, the servo motor may move the position of the support body so that the load measured by the load cell is maintained within a preset load range.

Further, the position variable support device may further include an air balancer for maintaining a horizontal state of the support body.

The laminator may further include: a substrate edge position controller provided between the substrate tension adjustment part and the heating roller part to adjust an edge position of the substrate transferred to the heating roller part; and a film edge position controller provided between the film tension adjustment part and the heating roller part to adjust an edge position of the film transferred to the heating roller part.

Further, the laminator may further include an edge image photographing part for photographing each of an edge of the substrate passing through the substrate edge position controller and an edge of the film passing through the film edge position controller.

Further, when the edge position of the substrate or the edge position of the film photographed by the edge image photographing part is out of a preset allowable position, the substrate edge position controller or the film edge position controller may adjust the edge position of the substrate or the edge position of the film.

The laminator may further include a film removing part for removing the film from the substrate in a state in which the plurality of coverlays is bonded to the substrate after the heating roller part bonds the substrate and the film such that the plurality of coverlays covers the metal pattern formed on the substrate.

Further, the laminator may further include a film removal image photographing part for checking whether the metal pattern formed on the substrate and the coverlay covering the metal pattern are defective after the film removing part removes the film bonded to the substrate.

Advantageous Effects

According to the exemplary embodiment of the present invention, the laminator performs bonding with a Roll-to-Roll (R2R) processing method to improve productivity, and improve precision by controlling tension.

BEST MODE

Figure 1:
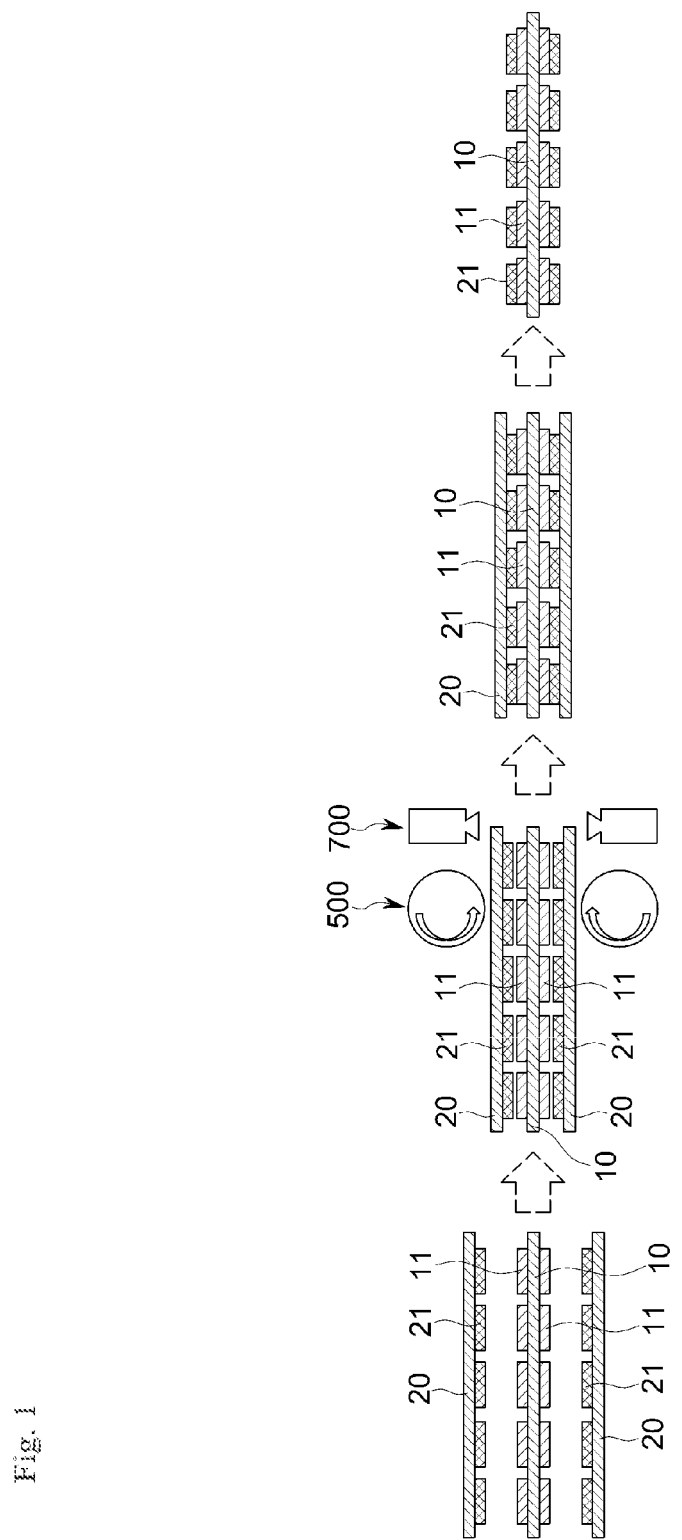
FIG. 1 is a conceptual diagram sequentially illustrating a bonding process performed by a laminator according to an exemplary embodiment of the present invention.

Hereinafter, an exemplary embodiment of the present invention will be described in detail with reference to accompanying drawings so as for those skilled in the art to easily carry out the present invention. The present invention can be implemented in various forms and is not limited to the exemplary embodiment described herein.

It should be noted that the drawings are schematic and not drawn to scale. Relative dimensions and proportions of parts in the drawings are shown exaggerated or reduced in size for clarity and convenience in the drawing, and a predetermined dimension is simply illustrative only and not limiting. Further, the same reference numerals are used for the same structure, element, or component shown in the two or more drawings in order to denote like features.

An exemplary embodiment of the present invention specifically represents an ideal embodiment of the present invention. As a result, various modifications of the drawings are expected. Accordingly, the exemplary embodiment is not limited to a specific form of the illustrated area, and includes, for example, a shape modification by manufacturing.

Hereinafter, a laminator 101 according to an exemplary embodiment of the present invention will be described with reference to FIGS. 1 to 6. The laminator 101 according to the exemplary embodiment of the present invention may be used for manufacturing a Flexible Printed Circuit Board (FPCB). In this case, the FPCB may include a substrate 10 made of a flexible insulating material, a metal pattern 11 formed by patterning a metal film on one or both surfaces of the substrate 10, and a coverlay 21 bonded to the substrate 10 to cover the metal pattern 11. For example, the substrate 10 and the coverlay 21 may be made of polyimide, and the metal film may be made of Cu foil. That is, the metal pattern 11 may be formed of copper (Cu).

Figure 2:
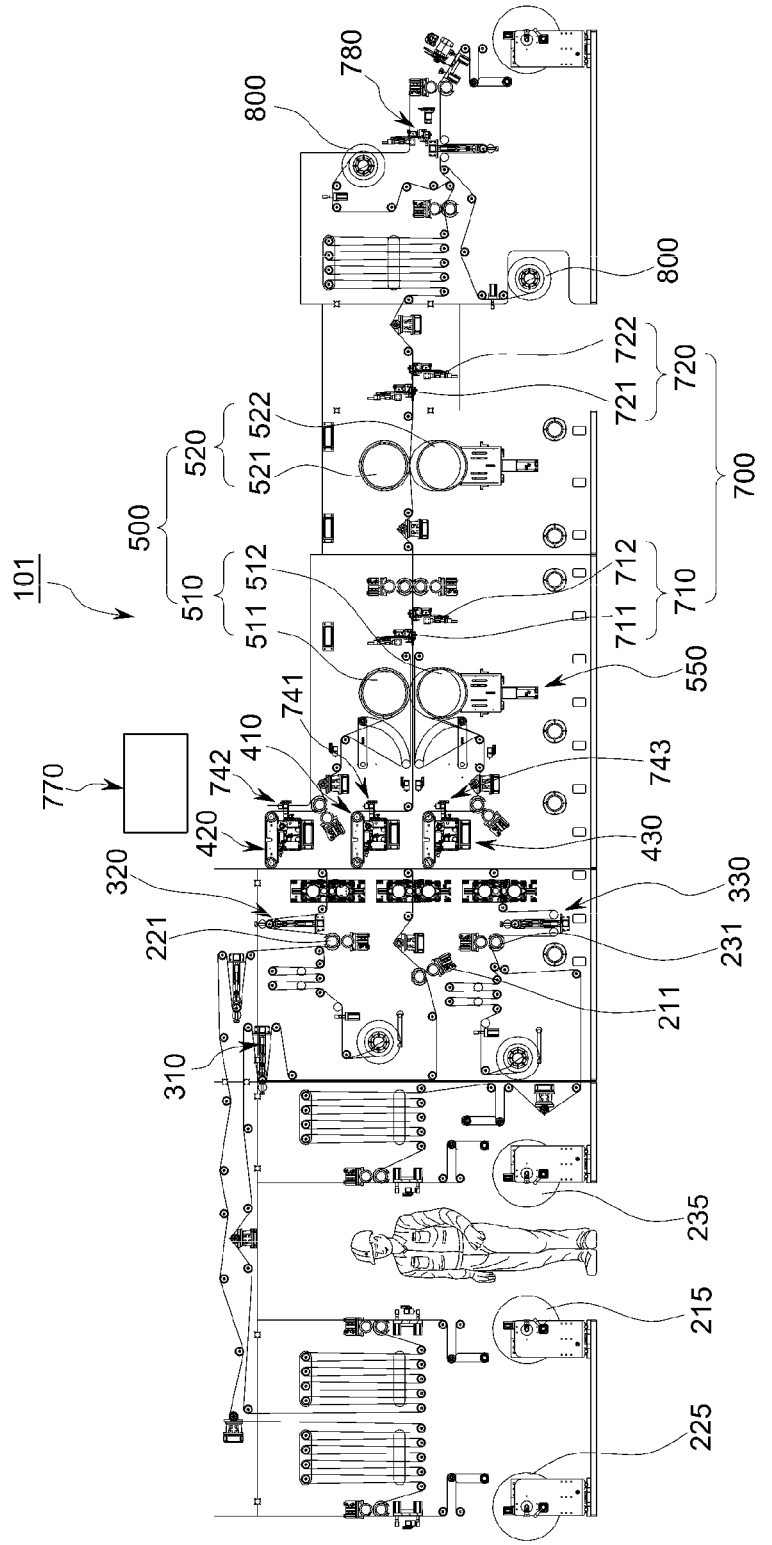
FIG. 2 is a front view of the laminator according to the exemplary embodiment of the present invention.

As illustrated in FIGS. 1 and 2, the laminator 101 according to the exemplary embodiment of the present invention includes a substrate supply part 210, coverlay supply parts 220 and 230, a heating roller part 500, and a substrate tension adjustment part 310, film tension adjustment parts 320 and 330, a bonding state image photographing part 700, and an adjustment part 770.

In addition, the laminator 101 according to the exemplary embodiment of the present invention may further include a substrate edge position controller 410, film edge position controllers 420 and 430, an edge image photographing part 740, a film removing part 800, and a film removal image photographing part 780.

The substrate supply part 210 supplies the substrate 10 on which the metal pattern 11 is formed for each predetermined unit area. Specifically, the substrate supply part 210 may include a substrate winder 215 on which the substrate 10 on which the metal pattern 11 is formed is wound, and a substrate feeder 211 for transferring the substrate 10 wounded on the substrate winder 215 to the heating roller part 500 which is to be described below.

In addition, the metal pattern 11 may be formed on one surface of the substrate 10 or may be formed on both surfaces of the substrate 10. Hereinafter, in the present specification, as illustrated in FIG. 1, a case in which the metal patterns 11 are formed on both surfaces of the substrate 10 will be described as an example.

The coverlay supply parts 220 and 230 supply a film 20 to which a plurality of coverlays 21 punched to a predetermined size are attached. Specifically, the coverlay supply parts 220 and 230 may include film winders 225 and 235 on which the film 20 to which the plurality of coverlays 21 are attached is wound, and film winders 225 and 235 for transferring the film wound on the film feeders 221 and 231 to the heating roller part 500 which is to be described below.

In addition, the coverlay supply parts 220 and 230 may include a first coverlay supply part 220 supplying the film which is to be bonded to one surface of the substrate 10, and a second coverlay supply part 230 supplying the film which is to be bonded to the other surface of the substrate 10.

The heating roller part 500 bonds the substrate 10 and the film 20 so that each of the plurality of coverlays 21 attached to the film 20 covers the metal pattern 11 formed on the substrate 10.

Specifically, the heating roller part 500 may include a pair of heating rollers 511 and 512 and a pair of heating rollers 521 and 522 opposite to both surfaces of the substrate 10, and a position variable support device 550 for adjusting an interval between the pair of heating rollers 511 and 512 and the pair of heating rollers 521 and 522 by moving a position of any one of the pair of heating rollers 511 and 512 and the pair of heating rollers 521 and 522.

An induction coil is installed inside the pairs of heating rollers 511, 512, 521, and 522, and the eddy current induced by a magnetic force line generated when an alternating current flows through the induction coil flows through the surface of the roller and the roller itself generates heat. In addition, a heat pipe having high-performance heat transfer characteristics is installed on the surface of the roller, so that the temperature deviation of the roller surface may be maintained within 0.5 degrees. The heating rollers 511, 512, 521, and 522 manufactured as described above have excellent thermal efficiency, semi-permanent lifespan, and uniform temperature distribution, so that the substrate 10 and the film 20 may be uniformly bonded.

Figure 3:
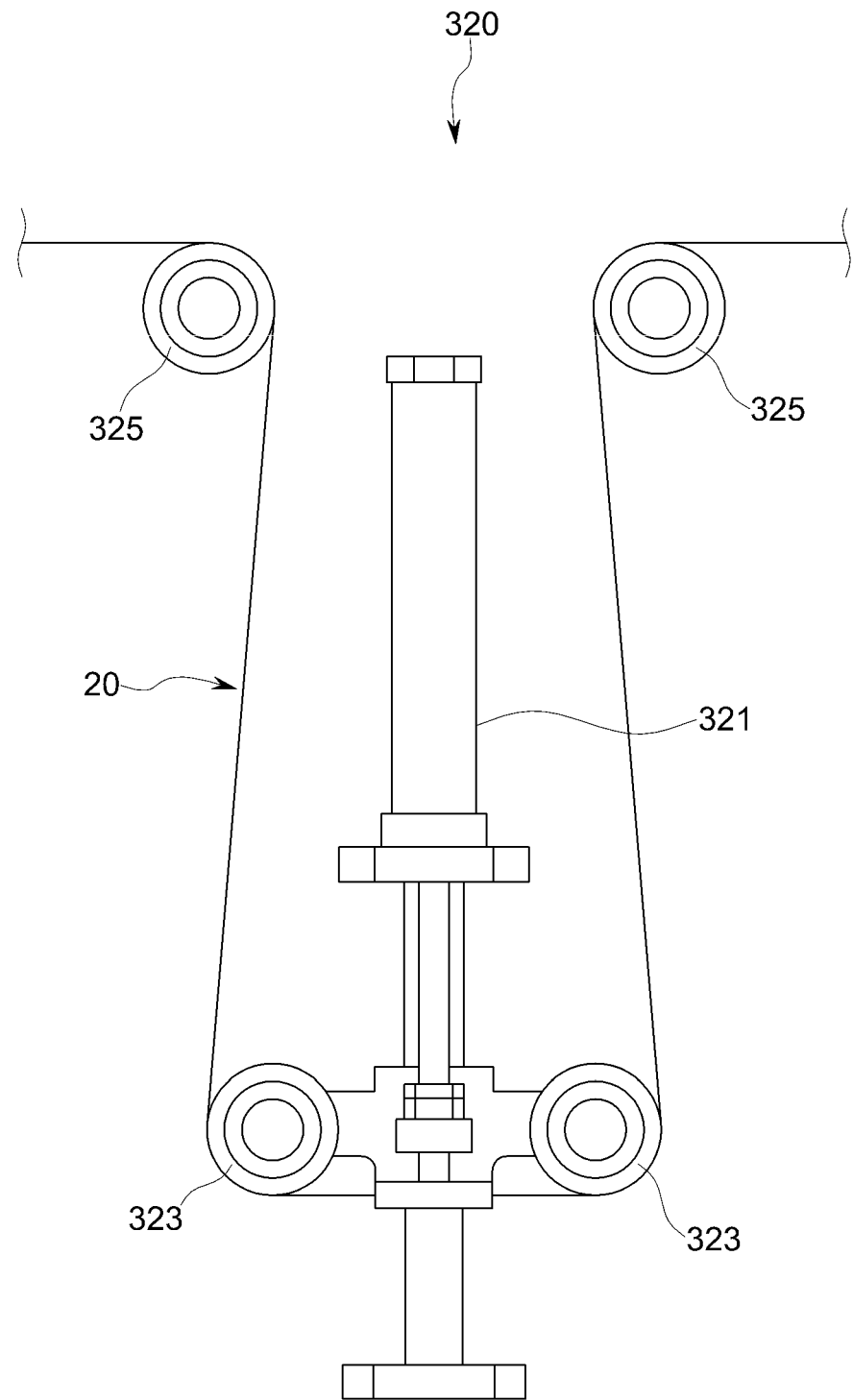
FIG. 3 is a cross-sectional view of a position variable support device for adjusting an interval between a pair of heating rollers used in the laminator of FIG. 2.
Figure 4:
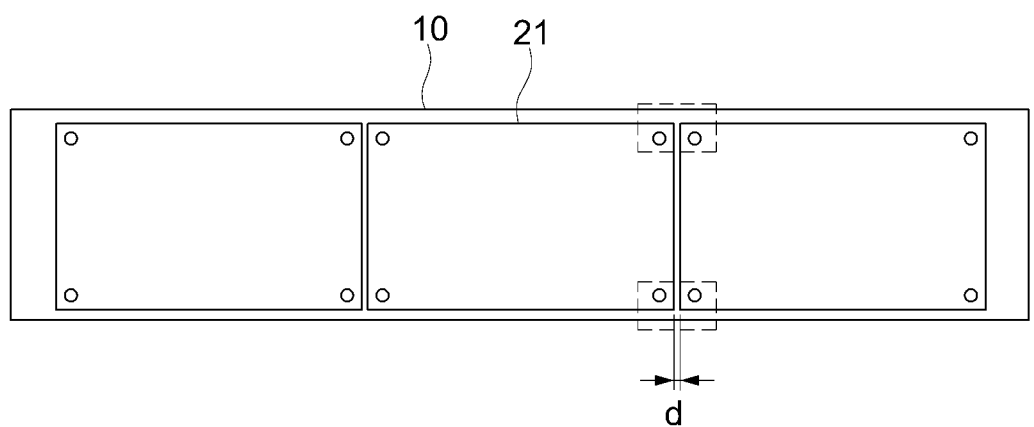
FIG. 4 is a front view illustrating a film tension adjustment part used in the laminator of FIG. 2.

As illustrated in FIG. 3, the variable position support device 550 includes a ball screw shaft 551, a support body 555 screwed to the ball screw shaft 551 and supporting any one of the pairs of heating rollers 511, 512, 521, 522, and a servo motor 553 for rotating the ball screw shaft 551 to move a position of the support body 555.

In addition, the variable position support device 550 may further include a load cell 557 for measuring a load applied to the support body 555 supporting the heating rollers 511, 512, 521, and 522. Further, the servo motor 553 may move the position of the support body 555 so that the load measured by the load cell 557 is maintained within a preset load range.

In addition, the position variable support device 550 may further include an air balancer 558 for maintaining a horizontal state of the support body 555.

As such, in the exemplary embodiment of the present invention, it is possible to evenly maintain force of compressing the substrate 10 and the film 20 by the pairs of heating rollers 511, 512, 521, 522 through the load cell 557 and the air balancer 558.

Further, the heating roller part 50 may include a pair of first heating rollers 510 opposite to both surfaces of the substrate 10, and a pair of second heating rollers 520 opposite to both surfaces of the substrate 10, located behind the pair of first heating rollers 510, and finally heating the substrate 10 and the film 20 which have been primarily heated by the pair of first heating rollers 510.

In order to bond the substrate 10 and the film 20, the heating rollers 511, 512, 521, and 522 need to maintain a fairly high temperature, and when the substrate 10 and the film 20 pass through the high-temperature heating rollers 511, 512, 521, and 522 at once, the heat is not sufficiently transferred to the inside of the substrate 10 and the film 20, resulting in poor bonding.

Therefore, the heating roller part 500 uses the pair of first heating rollers 510 and the pair of second heating rollers 520, and heat is gradually transferred into the substrate 10 and the film 20 by primarily heating the substrate 10 and the film 20 to a temperature relatively lower than the temperature required for bonding with the first heating roller 510, and then finally heating the substrate 10 and the film 20 to the temperature required for bonding with the second heating roller 520, thereby firmly bonding the substrate 10 and the film 20.

The substrate tension adjustment part 310 adjusts the tension of the substrate 10 supplied by the substrate supply part 210 to the heating roller part 500, and the film tension adjustment parts 320 and 330 adjust the tension of the film 20 supplied by the coverlay supply parts 220 and 230 to the heating roller part 500. Further, the film tension adjustment parts 320 and 330 may include a first film tension adjustment part 320 for adjusting the tension of the film 20 supplied by the first coverlay supply part 220, and a second film tension adjustment part 330 for adjusting the tension of the film 20 supplied by the second coverlay supply part 230.

In addition, the substrate tension adjustment part 310, the first film tension adjustment part 320, and the second film tension adjustment part 330 have the same basic structure except for a different subject for adjusting the tension. Hereinafter, in the present specification, a detailed configuration will be described with reference to FIG. 4 based on the first film tension adjustment part 320 as a representative example. That is, the detailed configurations of the substrate tension adjustment part 310 and the second film tension adjustment part 330 are the same as that of the first film tension adjustment part 320.

The first film tension adjustment part 320 includes a pair of tension adjusting fixed rollers 325, a pair of tension adjusting variable rollers 323, and a tension adjusting cylinder 321 for adjusting the distance between the pair of tension adjusting fixed rollers 325 and the pair of tension adjusting variable rollers 323 by moving the position of the pair of tension adjusting variable rollers 323. Here, the tension adjusting cylinder 321 operates pneumatically or hydraulically.

When the distance between the pair of tension adjusting fixed rollers 325 and the pair of tension adjusting variable rollers 323 is adjusted while the tension adjusting cylinder 321 is expanded and contracted, the tension applied to the film 20 passing through the pair of tension adjusting fixed rollers 325 and the pair of tension adjusting variable rollers 323 is adjusted. For example, when the distance between the pair of tension adjusting fixed rollers 325 and the pair of tension adjusting variable rollers 323 increases, the tension applied to the film 20 increases, and when the distance between the pair of tension adjusting fixed rollers 325 and the pair of tension adjusting variable rollers 323 decreases, the tension applied to the film 20 decreases.

Figure 5:
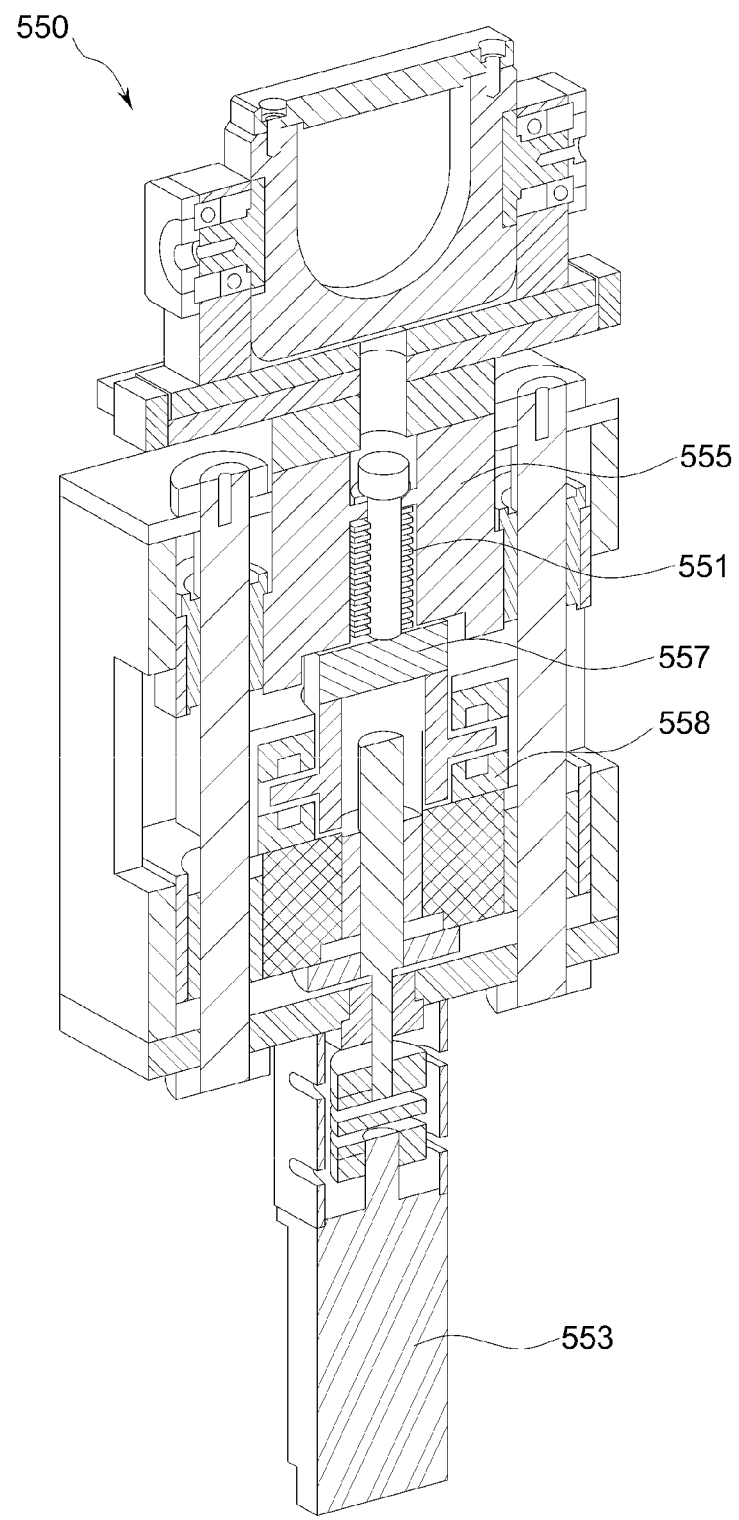
FIG. 5 is a top plan view illustrating a coverlay bonded to a substrate by the laminator of FIG. 2.

The bonding state image photographing part 700 measures the interval between the plurality of coverlays 21 after the heating roller part 500 bonds the substrate 10 and the film 20 to each other. FIG. 5 illustrates the coverlay 21 bonded to the substrate 10. In this case, the two bonding state image photographing parts 711 and 712 may photograph the coverlay 21 bonded to one surface of the substrate 10 and the coverlay 21 bonded to the other surface of the substrate 10, respectively.

Further, the bonding state image photographing unit 700 may include a first bonding state image photographing part 710 for measuring the interval between the plurality of coverlays 21 in the substrate 10 and the film 20 bonded by the pair of first heating rollers 510, and a second bonding state image photographing part 720 for measuring the interval between the plurality of coverlays 21 in the substrate 10 and the film 20 bonded by the pair of second heating rollers 520.

For example, as described above, a total of four bonding state image photographing parts 700 (711, 712, 721, and 722) may be installed. However, one exemplary embodiment of the present invention is not limited thereto, and the number of bonding state image photographing parts 700 may be adjusted depending on whether the metal pattern 11 is formed on both surfaces of the substrate 10 or on one surface of the substrate 10 and the number of heating rollers 511, 512, 521, and 522 used in the heating roller part 500.

The adjustment part 770 adjusts one or more of the tension of the substrate 10 adjusted by the substrate tension adjustment part 310 and the tension of the film 20 adjusted by the film tension adjustment parts 320 and 330 so that the interval between the plurality of coverlays 21 measured by the bonding state image photographing part 700 maintains a preset allowable interval. In this case, the adjustment part 770 adjusts the pneumatic or hydraulic pressure supplied to the substrate tension adjustment part 310 or the tension adjustment cylinder 321 of the film tension adjustment parts 320 and 330 to adjust the tension applied to the substrate 10 or the film 20. For example, the adjustment part 770 may be a regulator for adjusting the pneumatic pressure supplied to the tension adjusting cylinder 321.

Specifically, when the interval between the plurality of coverlays 21 measured by the bonding state image photographing part 700 is smaller than the preset allowable interval, the adjustment part 770 increases the tension applied to the film 20 to increase the interval between the plurality of coverlays 21. Conversely, when the interval between the plurality of coverlays 21 measured by the bonding state image photographing part 700 is larger than the preset allowable interval, the adjustment part 770 decreases the tension applied to the film 20 to decrease the interval between the plurality of coverlays 21.

In addition, when the intervals between the plurality of coverlays 21 measured by the bonding state image photographing part 700 are measured differently due to a difference occurring at both ends in the width direction, it may be determined that abnormality has occurred in the equipment.

The substrate edge position controller (EPC) 410 is provided between the substrate tension adjustment part 310 and the heating roller part 500 to adjust an edge position of the substrate 10 transferred to the heating roller part 500.

The film edge position controllers 420 and 430 are provided between the film tension adjustment parts 320 and 330 and the heating roller part 500 to adjust the edge position of the film 20 transferred to the heating roller part 500. Further, the film edge position controllers 420 and 430 may include a first film edge position controller 420 provided between the first film tension adjustment part 320 and the heating roller part 500, and a second film edge position controller 430 provided between the second film tension adjustment part 330 and the heating roller part 500.

The edge image photographing part 740 photographs the edge position of the substrate 10 passing through the substrate edge position controller 410 and the edge position of the film 20 passing through the film edge position controllers 420 and 430. In addition, the edge image photographing part 740 may also be divided into a substrate edge image photographing part 741, a first film edge image photographing part 742, and a second film edge image photographing part 742 depending on the object to be photographed.

Figure 6:
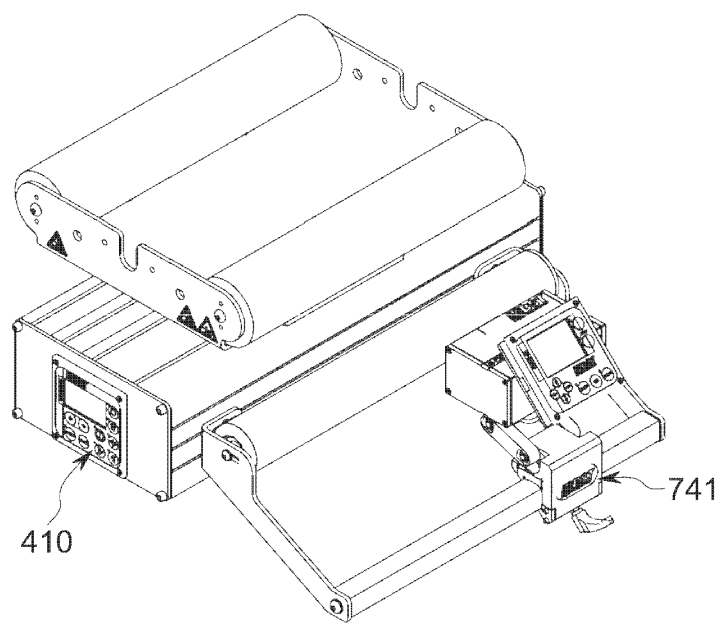
FIG. 6 is a perspective view illustrating a substrate edge position controller and an edge image photographing part used in the laminator of FIG. 2.

FIG. 6 is an enlarged perspective view illustrating the substrate edge position controller 410 and the substrate edge image photographing part 741. Also, the film edge position controllers 420 and 430 and the film edge image photographing parts 742 and 743 may be provided in the same manner as in FIG. 6. The substrate edge position controller 410 accurately aligns and winds the edge position of the substrate which is to be wound in a form developed from the general winder, thereby increasing the accuracy of the subsequent process.

When the edge position of the substrate 10 or the edge position of the film 20 photographed by the edge image photographing part 740 is out of a preset allowable position, the substrate edge position controller 410 or the film edge position controllers 420 and 430 adjust the edge position of the substrate 10 or the edge position of the film 20.

After the heating roller part 500 bonds the substrate 10 and the film 20 so that the plurality of coverlays 21 covers the metal pattern 11 formed on the substrate 10, the film removing part 800 removes the film 20 from the substrate 10 in the state where each of the plurality of coverlays 21 is bonded to the substrate 10.

After the film removing part 800 removes the film 20 bonded to the substrate 10, the film removal image photographing part 780 may finally check defects of the metal pattern 11 formed on the substrate 10 and the coverlay 21 covering the metal pattern.

By the foregoing configuration, the laminator 101 according to the exemplary embodiment of the present invention performs bonding by a roll-to-roll (R2R) processing method to improve productivity, and improve precision by controlling tension.

In addition, since the heating roller part 500 includes the pair of first heating rollers 510 and the pair of second heating rollers 520, it is possible to effectively bond the substrate 10 and the film 20 and suppress the occurrence of bonding defects.

In addition, the position variable support device 550 supporting the heating roller part 500 may adjust the interval between the pair of heating rollers 511 and 512 to evenly compress the substrate 10 and the film 20.

In addition, in addition to the bonding state image photographing part 700, the edge image photographing part 740 and the film removal image photographing part 780 may detect the occurrence of defects in the bonding process.

The exemplary embodiments of the present invention have been described with reference to the accompanying drawings, but those skilled in the art will understand that the present disclosure may be implemented in another specific form without changing the technical spirit or an essential feature thereof.

Accordingly, it will be understood that the aforementioned exemplary embodiments are described for illustrative and are not limited in all aspects, and it should be construed that the scope of the present disclosure shall be represented by the claims to be described below, and all of the changes or modified forms induced from the meaning and the scope of the claims, and an equivalent concept thereof are included in the scope of the present invention.

INDUSTRIAL APPLICABILITY

The laminator according to the exemplary embodiment of the present invention may be used for improving productivity by performing a bonding process with a Roll-to-Roll (R2R) processing method and improving precision by controlling tension.

DESCRIPTION OF REFERENCE NUMERAL

10: Substrate
11: Metal pattern
20: Film
21: coverlay
101: Laminator
210: Substrate supply part
211: Substrate feeder
215: Substrate winder
220, 230: Coverlay supply part
221, 231: Film feeder
225, 235: Film winder
310: Substrate tension adjustment part
320, 330: Film tension adjustment part
321: Tension adjusting cylinder
323: Tension adjusting variable roller
325: Tension adjusting fixed roller
410: Substrate edge position controller
420, 430: Film edge position controller
500: Heating roller part
510: First heating roller
520: Second heating roller
550: Position variable support device
551: Ball screw shaft
553: Servo motor
555: Support body
557: Load cell
558: Air balancer
700: Bonding state image photographing part
710: First bonding state image photographing part
720: Second bonding state image photographing part
740: Edge image photographing part
770: Adjustment part
780: Film removal image photographing part
800: Film removing part

The invention claimed is:
1. A laminator, comprising:
a substrate supply part for supplying a substrate on which a metal pattern is formed for each predetermined unit area;
a coverlay supply part for supplying a film to which a plurality of coverlays punched to a predetermined size is attached;
a heating roller part for bonding the substrate and the film so that the plurality of coverlays respectively covers the metal pattern;
a substrate tension adjustment part for adjusting tension of the substrate transferred to the heating roller part;
a film tension adjustment part for adjusting the tension of the film transferred to the heating roller part;
a bonding state image photographing part for measuring an interval between the plurality of coverlays after the heating roller part bonds bonding the substrate and the film; and
an adjustment part for adjusting any one or more of the tension of the substrate adjusted by the substrate tension adjustment part and the tension of the film adjusted by the film tension adjustment part so that the interval between the plurality of coverlays measured by the bonding state image photographing part maintains a preset allowable interval,
wherein the heating roller part includes:
a pair of first heating rollers opposite to both surfaces of the substrate; and
a pair of second heating rollers opposite to both surfaces of the substrate, located behind the pair of first heating rollers to secondarily heat the substrate and the film primarily heated by the pair of first heating rollers, and
wherein the bonding state image photographing part includes:
a first bonding state image photographing part for measuring an interval between the plurality of coverlays in the substrate and the film bonded by the pair of first heating rollers; and
a second bonding state image photographing part for measuring an interval between the plurality of coverlays in the substrate and the film bonded by the pair of second heating rollers.
2. The laminator of claim 1, wherein each of the substrate tension adjustment part and the film tension adjustment part includes:
a pair of tension adjusting fixed rollers;
a pair of tension adjusting variable rollers; and
a tension adjusting cylinder for adjusting a distance between the pair of tension adjusting fixed rollers and the pair of tension adjusting variable rollers by moving positions of the pair of tension adjusting variable rollers.
3. The laminator of claim 2, wherein the tension adjusting cylinder operates pneumatically or hydraulically, and
the adjustment part adjusts the pneumatic or hydraulic pressure supplied to the tension adjusting cylinder.
4. The laminator of claim 1, wherein the metal pattern is formed on each of both surfaces of the substrate, and
the coverlay supply part includes:
a first coverlay supply part for supplying a film which is to be bonded to one surface of the substrate; and
a second coverlay supply part for supplying a film which is to be bonded to the other surface of the substrate.
5. The laminator of claim 4, wherein the film tension adjustment part includes:
a first film tension adjustment part for adjusting the tension of the film supplied by the first coverlay supply part; and
a second film tension adjustment part for adjusting the tension of the film supplied by the second coverlay supply part.
6. The laminator of claim 1, wherein the substrate supply part includes:
a substrate winder on which the substrate is wound; and
a substrate feeder for transferring the substrate wound on the substrate winder to the heating roller part, and the coverlay supply part includes:
a film winder on which the film is wound; and
a film feeder for transferring the film wound on the film winder to the heating roller part.

7. The laminator of claim 1, wherein the heating roller part includes:
a pair of heating rollers opposite to both surfaces of the substrate; and
a position variable support device for adjusting an interval between the pair of heating rollers by moving a position of any one of the pair of heating rollers.

8. The laminator of claim 7, wherein the position variable support device includes:
a ball screw shaft;
a support body screwed to the ball screw shaft and supporting any one of the pair of heating rollers; and
a servo motor for rotating the ball screw shaft to move a position of the support body.

9. The laminator of claim 8, wherein the position variable support device further includes a load cell for measuring a load applied to the support body, and
the servo motor moves the position of the support body so that the load measured by the load cell is maintained within a preset load range.

10. The laminator of claim 8, wherein the position variable support device further includes an air balancer for maintaining a horizontal state of the support body.

11. The laminator of claim 1, further comprising:
a substrate edge position controller provided between the substrate tension adjustment part and the heating roller part to adjust an edge position of the substrate transferred to the heating roller part; and
a film edge position controller provided between the film tension adjustment part and the heating roller part to adjust an edge position of the film transferred to the heating roller part.

12. The laminator of claim 11, further comprising:
an edge image photographing part for photographing each of an edge of the substrate passing through the substrate edge position controller and an edge of the film passing through the film edge position controller.

13. The laminator of claim 12, wherein when the edge position of the substrate or the edge position of the film photographed by the edge image photographing part is out of a preset allowable position, the substrate edge position controller or the film edge position controller adjusts the edge position of the substrate or the edge position of the film.

14. A laminator, comprising:
a substrate supply part for supplying a substrate on which a metal pattern is formed for each predetermined unit area;
a coverlay supply part for supplying a film to which a plurality of coverlays punched to a predetermined size is attached;
a heating roller part for bonding the substrate and the film so that the plurality of coverlays respectively covers the metal pattern;
a substrate tension adjustment part for adjusting tension of the substrate transferred to the heating roller part;
a film tension adjustment part for adjusting the tension of the film transferred to the heating roller part;
a bonding state image photographing part for measuring an interval between the plurality of coverlays after the heating roller part bonds bonding the substrate and the film;
an adjustment part for adjusting any one or more of the tension of the substrate adjusted by the substrate tension adjustment part and the tension of the film adjusted by the film tension adjustment part so that the interval between the plurality of coverlays measured by the bonding state image photographing part maintains a preset allowable interval; and
a film removing part for removing the film from the substrate in a state in which the plurality of coverlays is bonded to the substrate after the heating roller part bonds the substrate and the film such that the plurality of coverlays covers the metal pattern formed on the substrate.

15. The laminator of claim 14, further comprising:
a film removal image photographing part for checking whether the metal pattern formed on the substrate and the coverlay covering the metal pattern are defective after the film removing part removes the film bonded to the substrate.

* * * * *